United States Patent [19]
Haukness

[11] Patent Number: 5,818,774
[45] Date of Patent: Oct. 6, 1998

[54] APPARATUS AND METHOD FOR A DATA PATH IMPLEMENTED USING NON-DIFFERENTIAL, CURRENT MODE TECHNIQUES

[75] Inventor: Brent S. Haukness, Garland, Tex.

[73] Assignee: Texas Instruments Incorporated, Dallas, Tex.

[21] Appl. No.: 972,688

[22] Filed: Nov. 18, 1997

Related U.S. Application Data

[63] Continuation of Ser. No. 685,644, Jul. 24, 1996, abandoned.

[51] Int. Cl.$^6$ .......................................................... G11C 7/00
[52] U.S. Cl. ............... 365/207; 365/189.07; 365/189.09; 326/66
[58] Field of Search .............................. 365/207, 189.07, 365/189.09, 191; 326/66

[56] References Cited

U.S. PATENT DOCUMENTS 4,797,583  1/1989  Ueno et al. ..................... 323/316 X
5,455,797  10/1995  Etoh et al. ..................... 365/189.06 X

*Primary Examiner*—Do Hyun Yoo
*Attorney, Agent, or Firm*—Mark Courtney; W. James Brady, III; Richard L. Donaldson

[57] ABSTRACT

The differential output signals from the sense amplifiers of a dynamic random access memory unit are applied to apparatus which converts these output signals to a non-differential current mode signal. The non-differential current mode signal is applied to a data line. The output signal from the data line is converted to a small swing voltage signal. The small swing voltage signal is compared with a reference voltage level thereby generating a full swing voltage output signal. The reference voltage level is generated by a sample and hold circuit which samples the small swing voltage level when the differential signals from the sensors are equal. The sampled level is stored for comparison with the small swing voltage level resulting from the sensing of the stored voltage level. The full swing voltage output signal is suitable for use with CMOS circuits associated with the dynamic random access memory unit.

55 Claims, 3 Drawing Sheets

APPARATUS AND METHOD FOR A DATA PATH IMPLEMENTED USING NON-DIFFERENTIAL, CURRENT MODE TECHNIQUES

This application is a Continuation of application Ser. No. 08/685,644, filed Jul. 24, 1996, now abandoned.

BACKGROUND OF THE INVENTION

1. Field of the Invention

This invention relates generally to dynamic random access memory (DRAM) units and, more particularly, to the signal paths which couple the local input/output (I/O) devices and the storage cells in dynamic semiconductor memories.

2. Description of the Related Art

In order to increase the speed of DRAM units, the use of current-mode techniques, as opposed to voltage mode techniques have been proposed to minimize the effect of parasitic capacitance over long data lines. However, typical current-mode circuits are implemented using differential circuit techniques. While the differential techniques have the advantage that the two interconnect lines simplify the detection of the signal, the two interconnect lines provide an undesirable increase in the area required to implement the signal path on the semiconductor chip.

A need has therefore been felt for apparatus and an associated technique which can take advantage of the increased speed of the current-mode techniques without incurring the penalty of increased implementing area.

SUMMARY OF THE INVENTION

The aforementioned and other features are accomplished, according to the present invention, by apparatus converting the differential output signals from the sense amplifiers of a dynamic random access memory unit to a non-differential current mode signal. The current mode signal is applied to a data line. The non-differential current mode signal transmitted by the data line is applied to apparatus which converts the current mode signal first to a small swing voltage signal and then to a large swing voltage signal suitable for use with circuits coupled to the dynamic random access memory unit. To convert the small swing voltage signal to a large swing voltage signal, sample and hold apparatus stores a reference signal against which the small swing voltage signal is compared. The comparison of the reference signal and the small voltage signal determined by the logic state detected by the sense amplifiers generates a full voltage swing output signal.

These and other features of the invention will be understood upon reading of the following description in conjunction with the figures.

DESCRIPTION OF THE PREFERRED EMBODIMENT(S)

1. Detailed Description of the Drawings

Figure 1:
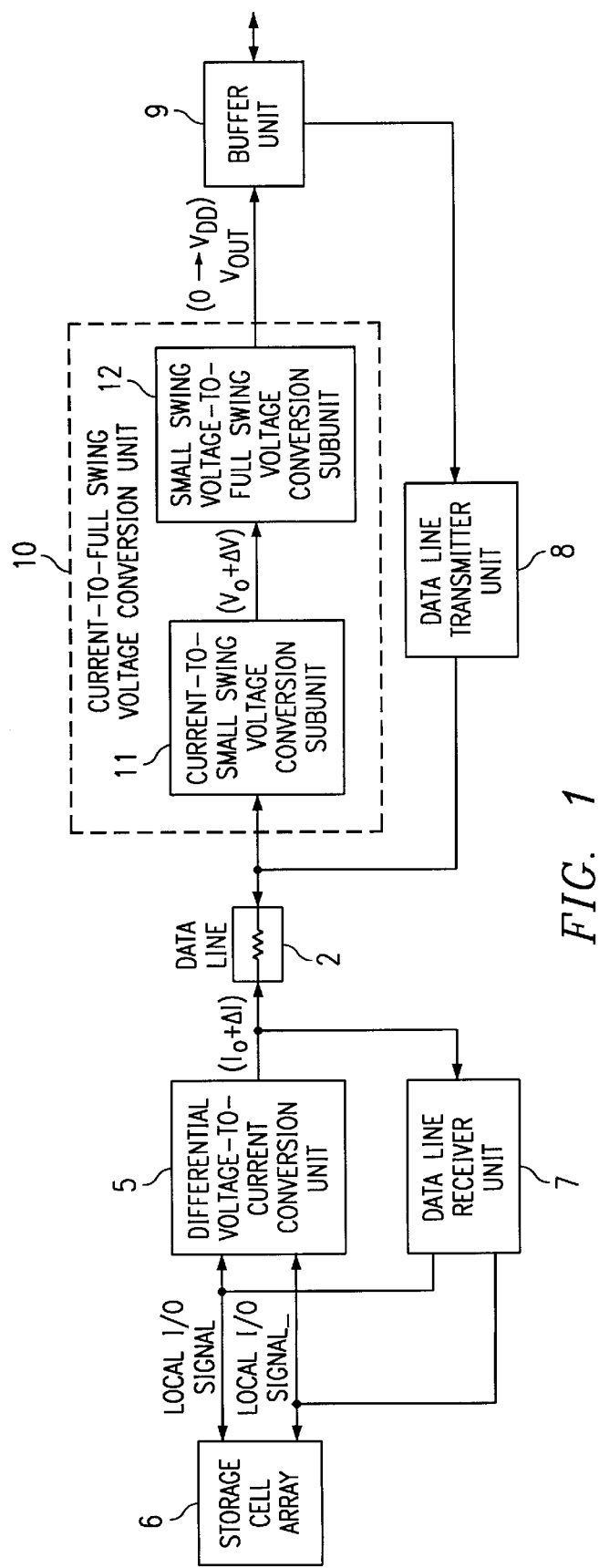
FIG. 1 is a block diagram of the data path non-differential current mode apparatus of the present invention.

Referring now to FIG. 1, a block diagram of the non-differential, current mode data path, according to the present invention, along with associated memory components of a memory unit, for retrieving data from a storage cell array is shown. The local input/output signal (LOCAL I/O SIGNAL) and the logical complement (LOCAL I/O SIGNAL_), both from the storage cell array 6 is applied to the differential voltage-to-current conversion unit 5. The output signal ($I_o\pm$ DELTA I) from the differential voltage to-current conversion unit is applied through the data line 2 to the current-to-small swing voltage conversion subunit 11 of the current-to-full swing voltage conversion unit 10. The output signal ($V_o\pm$ DELTA V) from the current-to-small swing voltage conversion subunit is applied to the small swing voltage-to-full swing voltage conversion subunit 12, subunit 12 providing the output signal $V_{OUT}$ (0->$V_{DD}$) for the non-differential, current mode data path. This signal $V_{OUT}$ is applied to buffer unit 9. For storing data in the storage cell array 6, buffer unit 9 applies signals through data line transmitter 8 to the data line 2. The signals transmitted by the data line 2 are applied through data line receiver unit 7 to the LOCAL I/O signal terminal and the LOCAL I/O_ signal terminal to the storage cell array 6.

Figure 2:
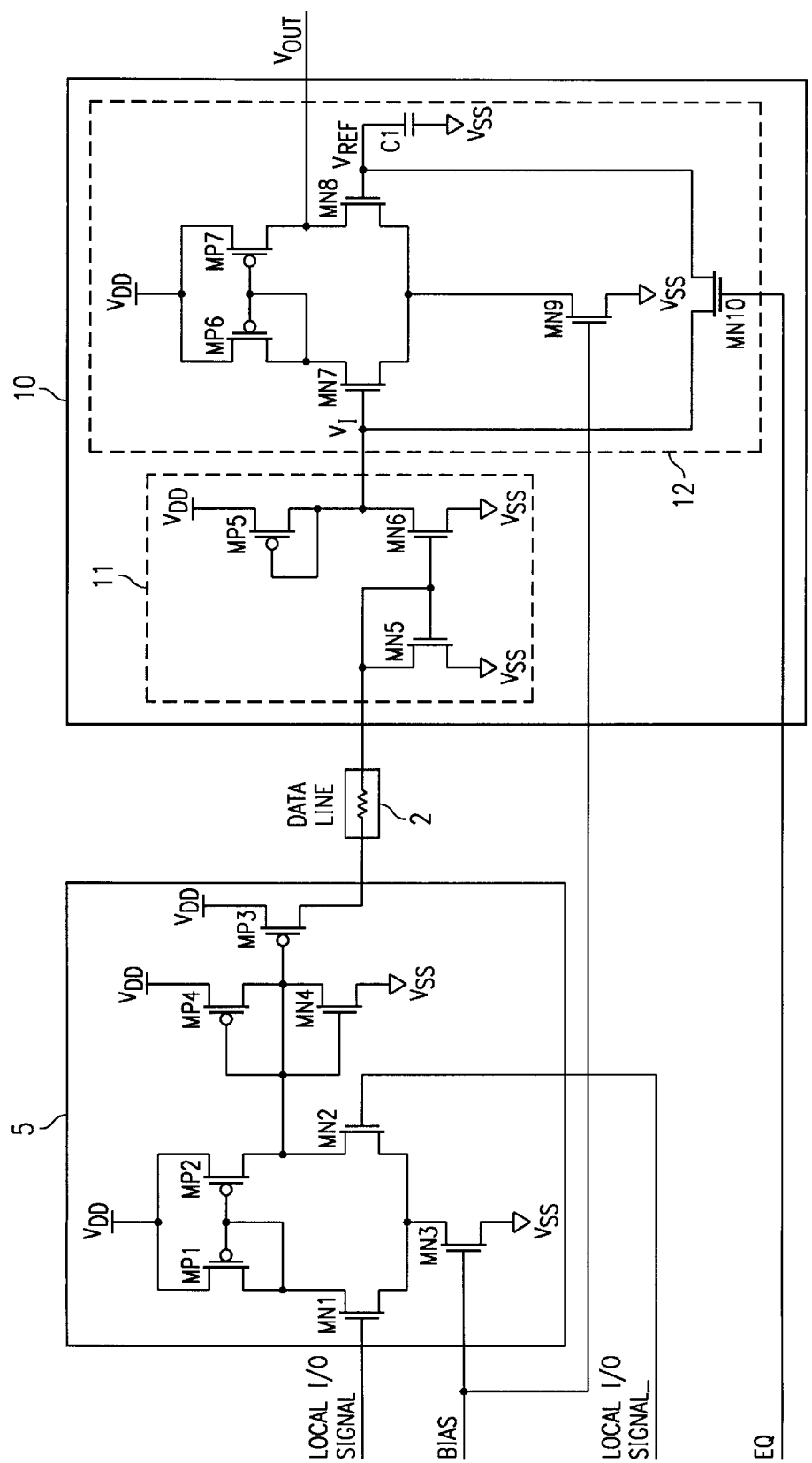
FIG. 2 is a schematic circuit diagram of the data path non-differential current mode apparatus of the present invention.

Referring to FIG. 2, a schematic diagram of the non-differential, current mode data path, according to the present invention, is shown. The LOCAL I/O SIGNAL is applied to a gate terminal of n-channel field effect transistor MN1, while the LOCAL I/O SIGNAL_ is applied to a gate terminal of N-channel field effect transistor MN2. The BIAS Signal is applied to a gate terminal of n-channel field effect transistor MN3 and to a gate terminal of n-channel field effect transistor MN9, while a source terminal of transistor MN3 is coupled to supply terminal $V_{SS}$. A drain terminal of transistor MN3 is coupled to a source terminal of transistor MN1 and to a source terminal of transistor MN2. A drain terminal of transistor MN1 is coupled to a drain and a gate terminal of p-channel field effect transistor MP1 and to a gate terminal of p-channel field effect transistor MP2. The source terminal of transistor MP1 and the source terminal of transistor MP2 are coupled to supply terminal $V_{DD}$. The drain terminal of transistor MP2 is coupled to a drain terminal of transistor MN2, to a gate and drain terminal of p-channel field effect transistor MP4, to a gate and a drain terminal of n-channel field effect transistor MN4, and to a gate terminal of P-channel field effect transistor MP3. The source terminal of transistor MN4 is coupled to voltage supply terminal $V_{SS}$. The source terminal of transistor MP4 and the source terminal of transistor MP3 are coupled to the voltage supply terminal $V_{DD}$. The drain terminal of transistor MP3 is, coupled through data line 2 to a drain and a gate terminal of n-channel field effect transistor MN5 and to a gate terminal of n-channel field effect transistor MN6. The data line 2 has both distributed resistance and distributed capacitance associated therewith. The source terminal transistor MN5 and the drain terminal of transistor MN6 are coupled to the voltage supply terminal $V_{SS}$. A drain terminal of transistor MN6 is coupled to a drain and a gate terminal of p-channel transistor MP5, to a gate terminal of transistor of n-channel field effect transistor MN7, and to a drain terminal of n-channel field effect transistor MN10. The source terminal of transistor MP5 is coupled to the voltage supply terminal $V_{DD}$. A drain terminal of transistor MN7 is coupled to a drain terminal and a gate terminal of p-channel field effect transistor MP6 and to a gate terminal of p-channel transistor field effect transistor MP7. A source terminal of transistor MP6 and a source terminal of transistor MP7 are coupled to the voltage supply terminal $V_{DD}$. A source terminal of transistor MN7 is coupled to a drain terminal of transistor MN9 and a source terminal of n-channel field effect transistor MN8. A source terminal of transistor MN9 is coupled to the voltage supply terminal $V_{SS}$. A gate terminal of transistor MN10 is coupled to an EQ Signal. A source terminal of transistor MN10 is coupled to a gate terminal of transistor MN8 and through capacitor C1 to the voltage supply terminal $V_{SS}$. A drain terminal of transistor MN8 and a drain terminal of transistor MP7 are coupled to the output terminal.

Figure 3:
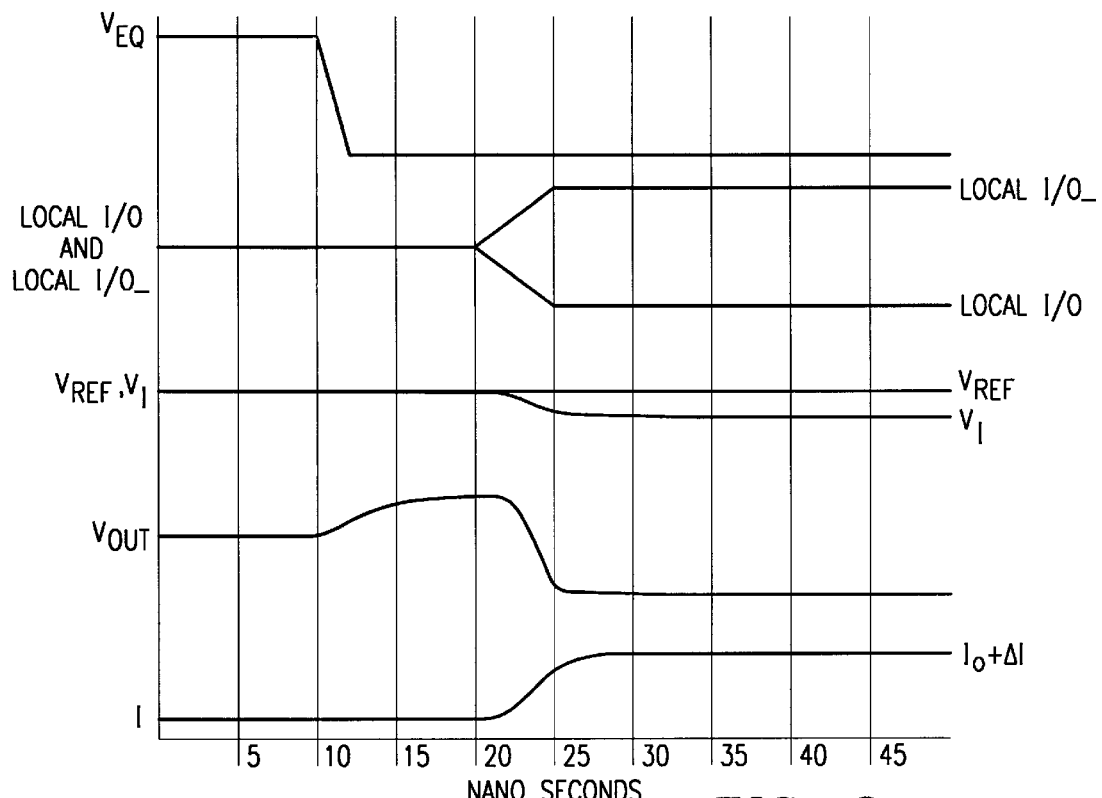
FIG. 3 illustrates a simulated READ '0' transition for the present invention.
Figure 4:
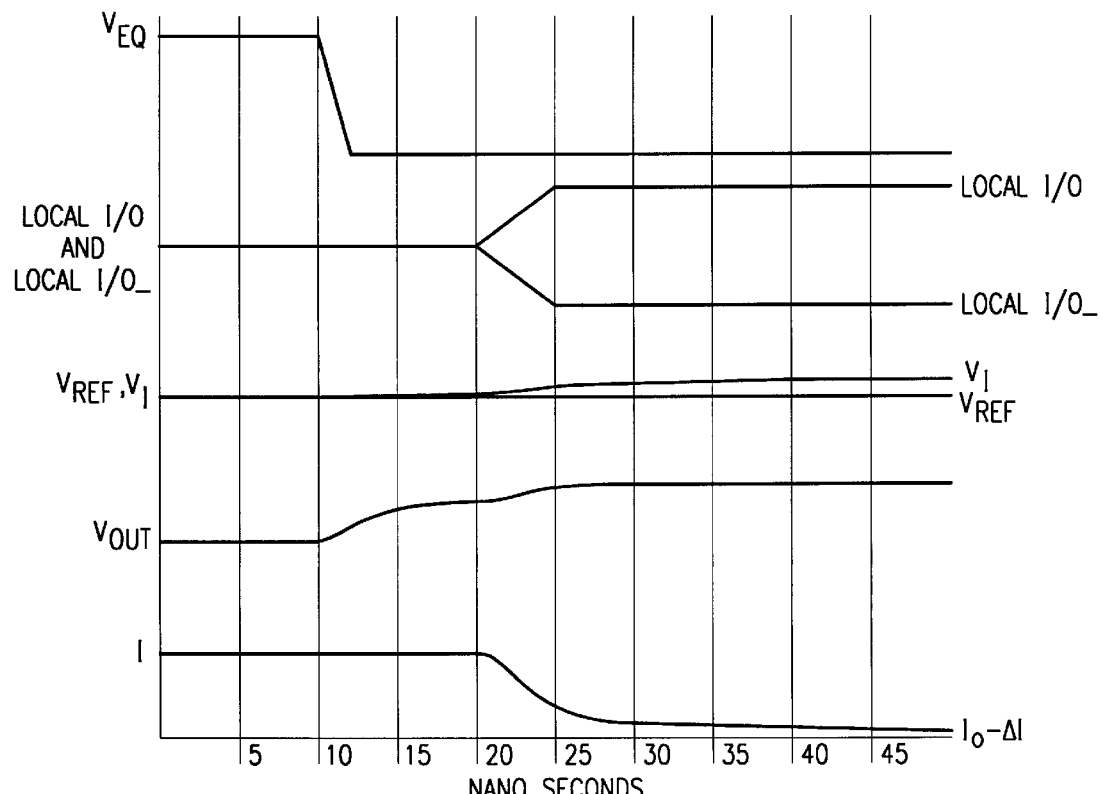
FIG. 4 illustrates a simulated READ '1' transition for the present invention.

Referring to FIGS. 3 and 4, simulated waveforms for the READ '0' transition (i.e., LOCAL I/O SIGNAL→low, LOCAL I/O SIGNAL_→high) and the READ '1' (LOCAL I/O SIGNAL→high, LOCAL I/O SIGNAL_→low), respectively are shown. During the first 20 nanoseconds, the voltage $V_1$ (i.e., the voltage applied to the gate terminal of transistor MN7) and the voltage $V_{REF}$ (i.e., the voltage applied to the gate of transistor MN8) are equalized. After the equalization period, then the data read, '0' in FIG. 3 and '1' in FIG. 4, is initiated.

2. Operation of the Preferred Embodiment(s)

The general concept of the present non-differential, current mode data path is shown in FIG. 1. The LOCAL I/O SIGNALS (and their complements) are conventional full swing differential signals originating from sense amplifiers. These differential input signals are converted to non-differential, current mode signals with an approximately constant voltage and at current swing of $I_o \pm$ DELTA I. Because the voltage swing is limited (ideally zero), the capacitance of the data line has little effect on the propagation delay. At the receiver end of the data line, the current mode signal is converted to a full swing CMOS output signal level suitable for use by the coupled circuitry. The current-to-full swing conversion is accomplished in practice in two increments. The first increment converts the current swing to a small swing voltage signal $V_o \pm$ DELTA V. This small swing voltage signal is then converted to a full swing CMOS level by the second stage.

The implementation of the non-differential, current mode data line, according to the present invention is shown in FIG. 2. The differential voltage of the LOCAL I/O SIGNALs is converted to a signal voltage output using a differential amplifier (i.e., transistors MP1–MP2 and MN1–MN3). The output of the differential amplifier drives the gate of transistor MP3, the transistor MP3 modulating the current through the data line. The voltage applied to the gate of transistor MP3 is limited by transistors MP4 and MN4 to ensure that the transistor MP3 remains in saturation. At the receiver end of the data line, a current mirror is formed by transistors MN5 and MN6. The mirrored current through MN6 is passed through a diode-connected transistor MP5, thereby creating a voltage swing at the gate of transistor MN7.

In the typical differential data line implementation, the conversion to a full voltage swing signal is easily accomplished because the differential voltage between the two lines is increasing either positively or negatively. For the non-differential situation, this conversion is more difficult because the voltage signal is swinging around the positive voltage. To perform the conversion in the preferred embodiment voltage applied to the gate of transistor MN7 should be compared to a reference voltage. In the preferred embodiment, the reference voltage is supplied by a sample and hold technique, i.e., sampling the initial voltage at the gate of M7 during precharge and holding this sampled voltage during the data sense operation. This sampling process eliminates the potential problem of having a reference voltage that shifts independently of the operation point of the data path circuitry, a process which could result in a reduced operation margin.

The comparator consists of a differential amplifier formed by transistors MP6–MP7 and MN7–MN9. The small swing voltage at the gate of transistor MN7 is coupled to one end of the differential amplifier. The voltage at the gate of transistor MN8 is generated before the sensing begins by bringing the EQ Signal high. The LOCAL I/O SIGNALS are equalized at this time and the voltage at the gate of transistor MN7 is therefore at the equilibrium center value. With the EQ Signal high, transistor MN10 is on, a condition which equalizes the voltage applied to the gate of transistor MN7 and the voltage applied to the gate of transistor MN8 and charges the capacitor C1. When the EQ Signal turned off, capacitor C1 maintains the gate voltage of transistor MN8 at the precharged level. Once the LOCAL I/O SIGNALs separate, the gate voltage at transistor MN7 either swings up or swings down from the initial value, the polarity of the swing depending on the sensed state. The voltage $V_{out}$ therefore swings positively or negatively, accordingly. In practice, an inverter or latch unit would be the next stage to ensure that the full swing voltage level is maintained.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. For example, certain control signals needed to activate and coordinate the memory unit are not shown. Similarly, in the implementation of the present invention, provision would have to be made to eliminate the current drain when the device is in a standby mode of operation. It is accordingly intended that the claims shall cover all modifications and applications as do not depart from the spirit and scope of the invention.

What is claimed is:

1. Apparatus coupled to a data line for receiving a differential signal and generating a full swing output voltage, said apparatus comprising:

a differential voltage-to-current conversion unit for receiving said differential signal and applying a current signal to said data line;

a current-to-small swing voltage conversion unit for receiving said current signal from said data line and generating a small swing voltage signal therefrom; and a small swing voltage-to-full swing voltage conversion unit for receiving said small swing voltage signal and generating said full swing output voltage therefrom.

2. The apparatus of claim 1 wherein said small swing voltage-to-full swing voltage conversion unit includes:

a comparator; and a reference voltage apparatus for providing a reference voltage against which said small swing voltage signal can be compared.

3. The apparatus of claim 2 wherein said reference voltage apparatus includes a sample and hold circuit.

4. The apparatus of claim 3 wherein said differential signal comprises a pair of complementary signals that are provided by sense amplifiers associated with a storage cell of a dynamic random access memory storage unit.

5. The apparatus of claim 4 wherein said full swing output voltage is suitable for use with CMOS circuits associated with said dynamic random access memory storage unit.

6. The apparatus of claim 5 wherein said comparator has a differential amplifier.

7. The method for providing a non-differential current mode data path, said method comprising the steps of:

converting differential output signals from sense amplifiers to a non-differential current mode signal;

applying said non-differential current mode signal to a data line;

converting said non-differential current mode signal transmitted by said data line to a small swing voltage signal; and converting said small swing voltage signal to a full swing voltage signal.

8. The method of claim 7 wherein said converting said small swing voltage signal step includes the step of: comparing said small swing voltage signal to a reference voltage.

9. The method of claim 8 wherein said converting said small swing voltage signal step includes the step of sampling said small swing voltage signal during a time when said sense amplifiers are not sensing a voltage level of storage cells, said sampling step providing said reference voltage.

10. The method of claim 9 wherein said converting said small swing voltage signal step includes the step of storing said reference voltage.

11. The method of claim 10 wherein said converting said small swing voltage signal step includes the step of comparing said stored reference voltage with said small swing voltage signal.

12. In a dynamic random access memory unit, apparatus associated with a data line for transmitting signals from sense amplifiers to circuits coupled to said memory unit, said apparatus comprising:

first means for converting differential voltage signals from said sense amplifiers to a non-differential current mode signal, said first means applying said non-differential current mode signal to said data line; and second means for converting said non-differential current mode signal from said data line to a full swing voltage signal suitable for use with CMOS circuits, said second means further comprising:

third means for converting said non-differential current mode signal to a small swing voltage signal; and fourth means for converting said small swing voltage signal to said full swing voltage signal.

13. The apparatus of claim 12 wherein said fourth means has:

storage means for storing a reference voltage; and comparison means for comparing said small swing voltage signal with said reference voltage.

14. The apparatus of claim 13 wherein said reference voltage is generated during a time period when the differential voltage signals from said sense amplifiers are equal.

15. The apparatus of claim 14 wherein said comparison means has a differential amplifier, said differential amplifier having said reference voltage applied to a first input terminal and said small swing voltage signal applied to a second input terminal.

16. The apparatus of claim 15 wherein said storage means is a capacitor.

17. The apparatus of claim 16 wherein said third means has current mirror.

18. A memory unit comprising:

a storage cell array;

a buffer unit;

a data line;

write apparatus for applying signals from said buffer unit through said data line to said storage cell array; and read apparatus for applying signals from said storage cell array through said data line to said buffer unit, said read apparatus further comprising:

a differential voltage-to-current conversion unit for receiving a differential signal and applying a current signal to said data line;

a current-to-small swing voltage conversion unit for receiving said current signal from said data line and generating a small swing voltage signal therefrom; and a small swing voltage-to-full swing voltage conversion unit for receiving said small swing voltage signal and generating a full swing output voltage therefrom.

19. Circuitry for conducting a signal, comprising:

a differential voltage to current conversion circuit having a first input for receiving a first signal having a voltage swing of a first magnitude, a second input for receiving a second signal that is a complement of the first signal and having a voltage swing of said first magnitude, and transmitting a current signal responsive to the first and second signals, the current signal having a voltage swing of a second magnitude that is substantially smaller than said first magnitude; and a current to voltage conversion circuit for receiving said current signal and for transmitting an output voltage responsive to said current signal.

20. The circuitry of claim 19, wherein said current to voltage conversion circuit further comprises:

a current to small-signal voltage conversion circuit for receiving said current signal and transmitting a small-signal voltage having a voltage swing of a third magnitude; and a small-signal to large-signal voltage conversion circuit for receiving said small-signal voltage and for transmitting said output voltage responsive to said small-signal voltage, said output voltage having a voltage swing of a fourth magnitude that is substantially greater than said third magnitude.

21. The circuitry of claim 20, wherein said small-signal to large-signal voltage conversion circuit further comprises:

a differential circuit having at least two inputs and receiving said small-signal voltage at a first input.

22. The circuitry of claim 20, wherein said small-signal to large signal voltage conversion circuit further comprises:

a differential circuit having at least two inputs, wherein said two inputs are coupled together by the source-drain path of a transistor responsive to a control signal.

23. The circuitry of claim 20, wherein said current signal has a current magnitude which varies responsive to the differential voltage between the first signal and the second signal.

24. The circuitry of claim 22, wherein the voltage present at said two inputs of said differential circuit is made approximately equal responsive to a first logic state of said control signal.

25. The circuitry of claim 24, wherein said differential circuit further comprises:

a sample and hold circuit coupled to one of said at least two inputs, said sample and hold circuit maintaining a reference voltage at said one of said at least two inputs responsive to a second logic state of said control signal.

26. The circuitry of claim 20, wherein the fourth magnitude voltage swing is approximately the magnitude of a Vdd supply voltage.

27. The circuitry of claim 19, wherein said signal being conducted is a data signal.

28. The circuitry of claim 19, wherein said signal being conducted is a data signal received from a sense amplifier.

29. An integrated circuit having a path for conducting a signal, comprising:
- a differential voltage to current conversion circuit having a first input for receiving a first signal having a voltage swing of a first magnitude, a second input for receiving a second signal which is a complement of said first signal and which has a voltage swing of said first magnitude, and transmitting a current signal having a voltage swing of a second magnitude responsive to said first and second signals;
- a current to small-swing voltage conversion circuit having a first input for receiving said current signal and transmitting a first output voltage having a voltage swing of a third magnitude; and
- a small-swing to large-swing voltage conversion circuit having a first input for receiving said first output voltage and transmitting a second output voltage having a voltage swing of a fourth magnitude, said second magnitude being substantially greater than said third magnitude.

30. The integrated circuit of claim 29, wherein said first magnitude is substantially greater than said second magnitude.

31. The integrated circuit of claim 29, wherein said third magnitude is substantially greater than said second magnitude.

32. The integrated circuit of claim 29, wherein said second magnitude is approximately zero.

33. The integrated circuit of claim 29, wherein said current signal is a signal having a substantially constant voltage and a current which varies in magnitude responsive to the differential voltage between said first and second signals.

34. The integrated circuit of claim 29, wherein said small-swing to large-swing voltage conversion circuit comprises:
- a differential circuit having at least two inputs, the first input of said at least two inputs receiving said first output voltage.

35. The integrated circuit of claim 34, and further comprising:
- a sample and hold circuit coupled to a second input of said at least two inputs of said differential circuit.

36. The integrated circuit of claim 35, and further comprising:
- an equalization circuit for coupling said at least two inputs together responsive to a control signal.

37. The integrated circuit of claim 36, wherein equal voltages are placed at said at least two inputs responsive to a first logic state of said control signal and wherein said sample and hold circuit maintains said equal voltage at said second input of said at least two inputs responsive to a second logic state of said control signal.

38. The integrated circuit of claim 36, wherein said equalization circuit comprises a transistor having its source drain path coupled between said at least two inputs, and having said control signal at its gate.

39. The integrated circuit of claim 29, wherein said integrated circuit is a memory device.

40. The integrated circuit of claim 29, wherein said integrated circuit is a random access memory device.

41. The integrated circuit of claim 29, wherein said integrated circuit is a dynamic random access memory device.

42. The integrated circuit of claim 29, wherein said fourth magnitude is approximately the magnitude of a Vdd supply voltage.

43. The integrated circuit of claim 29, wherein said signal being conducted is a data signal.

44. The integrated circuit of claim 29, wherein said signal being conducted is a data signal received from a sense amplifier.

45. A method for conducting a signal in a memory integrated circuit, comprising the steps of:
- receiving a first signal having a voltage swing of a first magnitude;
- receiving a second signal which is a complement of said first signal, said second signal having a voltage swing of said first magnitude;
- outputting a current signal responsive to said first and second signals, said current signal having a voltage swing of a second magnitude;
- transmitting said current signal along a path;
- generating a first output voltage responsive to said current signal, said first output voltage having a voltage swing of a third magnitude; and
- generating a second output voltage responsive to said first output voltage, said second output voltage having a voltage swing of a fourth magnitude that is substantially greater than said third magnitude.

46. The method of claim 45, wherein said first magnitude is substantially greater than said second magnitude.

47. The method of claim 45, wherein said third magnitude is substantially greater than said second magnitude.

48. The method of claim 45, wherein said fourth magnitude is substantially greater than said second magnitude.

49. The method of claim 45, wherein said fourth magnitude is approximately equal to the magnitude of a Vdd supply voltage to the memory integrated circuit.

50. The method of claim 45, wherein said step of outputting a current signal comprises the step of outputting a signal with a substantially constant voltage and a variable current magnitude.

51. The method of claim 45, wherein said second magnitude is approximately zero.

52. The method of claim 45, wherein the step of generating a second output voltage further comprises the steps of:
- receiving said first output voltage at a first input to a differential circuit;
- receiving a reference voltage at a second input to said differential circuit; and
- outputting said second output voltage, said second output voltage having a magnitude that is responsive to the difference between said first output voltage and said reference voltage.

53. The method of claim 52, wherein said step of receiving a reference voltage at a second input further comprises the steps of:
- providing a voltage at said first input;
- coupling said first and second inputs together responsive to a first logic state of a control signal; and
- maintaining said voltage of said first input at said second input responsive to a second logic state of said control signal.

54. The method of claim 53, wherein the step of maintaining said voltage of said first input at said second input comprises the steps of:
- providing a sample and hold circuit at said second input; and
- storing said voltage of said first input in said sample and hold circuit.

55. The method of claim 45, wherein the method for conducting a signal further comprises the step of conducting a data signal.

* * * * *